(12) United States Patent
Makimoto

(10) Patent No.: US 6,489,205 B1
(45) Date of Patent: Dec. 3, 2002

(54) SEMICONDUCTOR DEVICE AND METHOD FOR MANUFACTURING THE SAME

(75) Inventor: Hiromi Makimoto, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 100 days.

(21) Appl. No.: 09/265,895

(22) Filed: Mar. 11, 1999

(30) Foreign Application Priority Data

Sep. 4, 1998 (JP) ............................................. 10-251335

(51) Int. Cl.$^7$ .............................................. H01L 21/76
(52) U.S. Cl. ...................................... 438/297; 438/440
(58) Field of Search ................................. 438/440, 298, 438/225, 362, 297

(56) References Cited

U.S. PATENT DOCUMENTS

| | | | | |
|---|---|---|---|---|
| 5,308,787 A | * | 5/1994 | Hong et al. | 438/440 |
| 5,332,804 A | * | 6/1994 | Beasom | 438/298 |
| 5,358,894 A | * | 10/1994 | Fazan et al. | 438/440 |
| 5,372,951 A | * | 12/1994 | Anjum et al. | 438/440 |
| 5,473,186 A | | 12/1995 | Morita | 257/519 |
| 5,959,330 A | * | 9/1999 | Tokuyama et al. | 438/298 |

FOREIGN PATENT DOCUMENTS

| | | |
|---|---|---|
| EP | 0 631 307 | 12/1994 |
| JP | 64-67958 | 3/1989 |
| JP | 4-15922 | 1/1992 |
| JP | 7-74235 | 3/1995 |
| KR | 95-1988 | 6/1993 |

OTHER PUBLICATIONS

Stanley Wolf Silicon Processing for the VSLI Era vol. 2 Lattice Press p. 26, 1990.*

* cited by examiner

Primary Examiner—Olik Chaudhuri
Assistant Examiner—David S Blum
(74) Attorney, Agent, or Firm—McDermott, Will & Emery

(57) ABSTRACT

There is described a method for manufacturing a semiconductor device, in which an isolation oxide film having a superior dimensional accuracy and an isolation oxide film of a high withstanding voltage are manufactured in simple processes. A semiconductor device including a plurality of isolation oxide films of different thickness is manufactured. A nitride film and a resist film are grown on a silicon substrate, and openings are formed in the resist film. Openings are formed in the nitride film while the resist film is used as a mask. Isolation oxide films are formed below the openings through thermal oxidation. An opening diameter of the large opening formed in the nitride film is set to a value of more than 0.6 μm, whereas an opening diameter of the smaller opening is set a predetermined value of less than 0.6 μm. More specifically, the removal value of the smaller opening is set to a value required for imparting a desired thickness to the isolation oxide film 42.

3 Claims, 3 Drawing Sheets

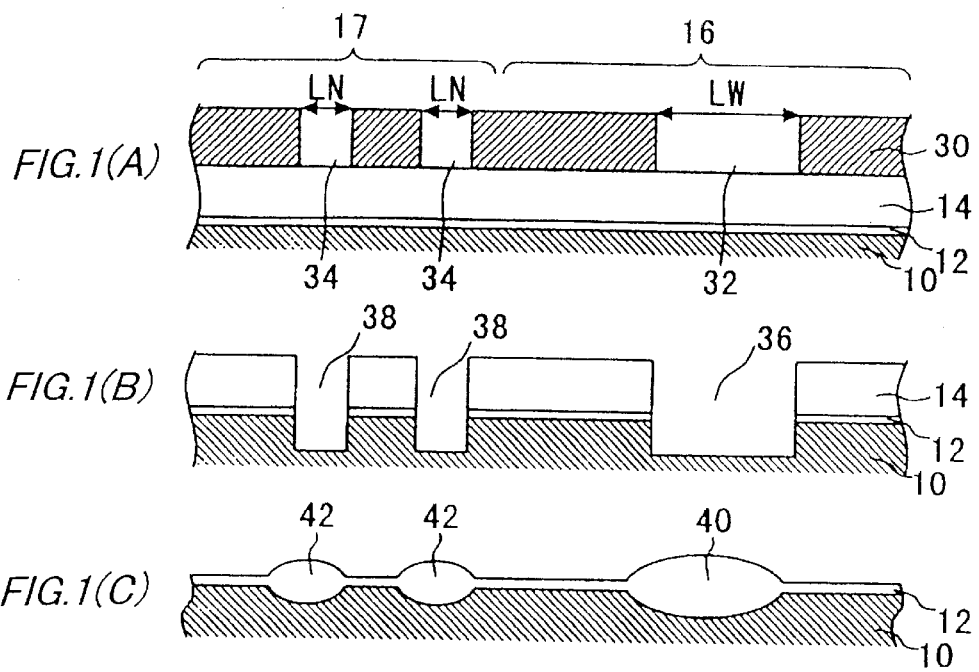
FIG.1(A)
FIG.1(B)
FIG.1(C)
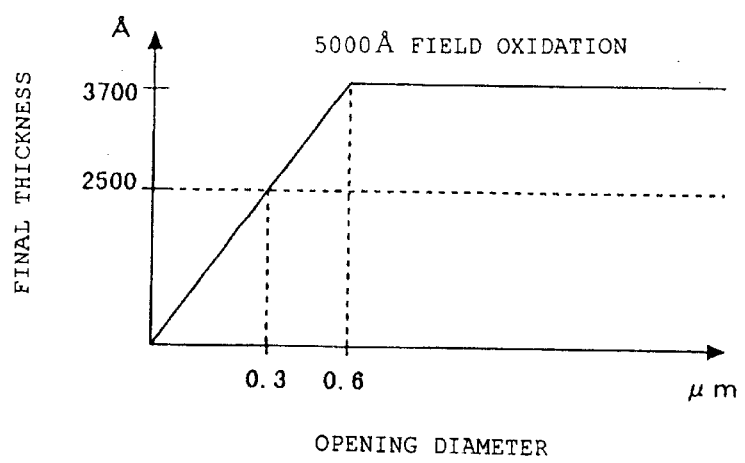
FIG.2

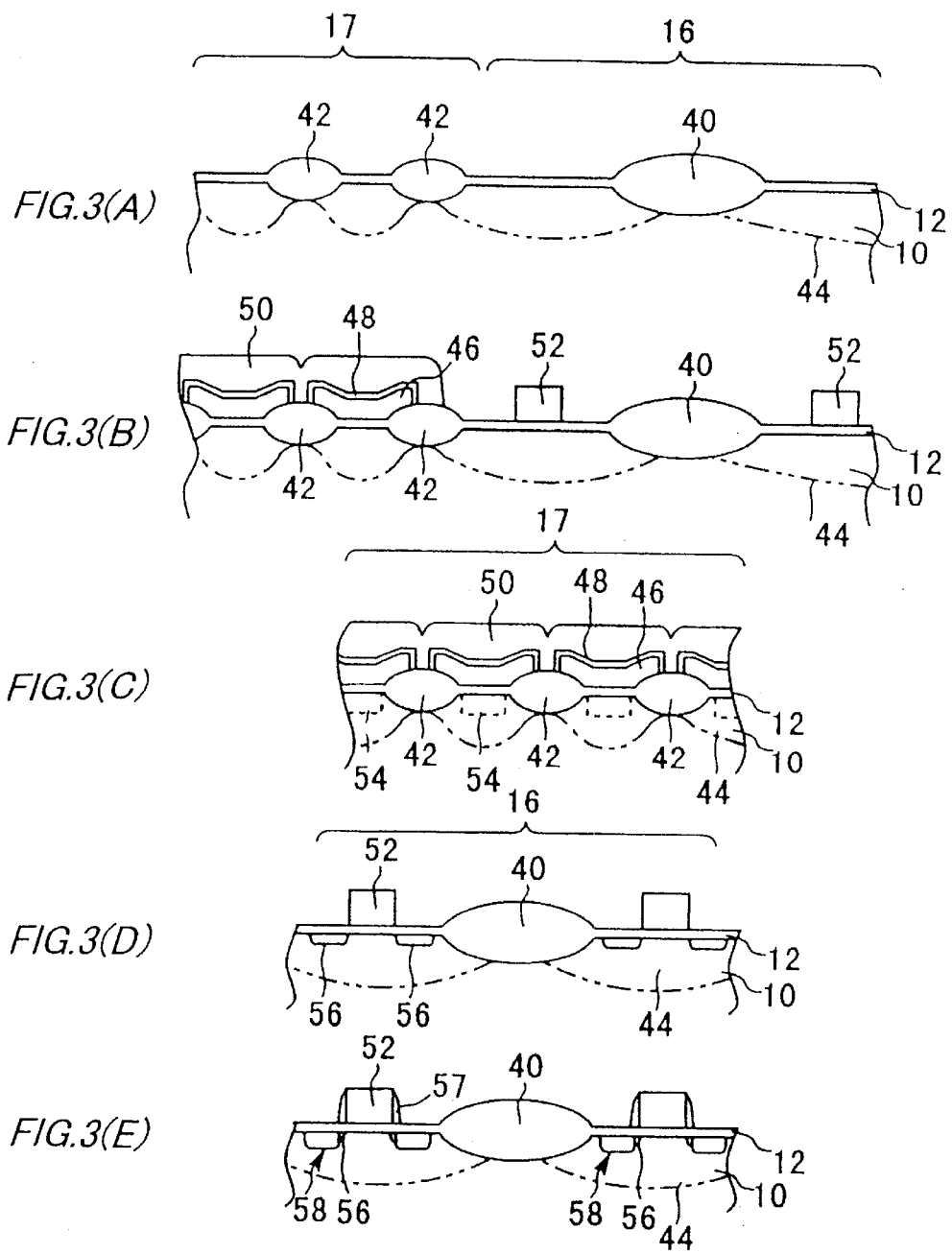

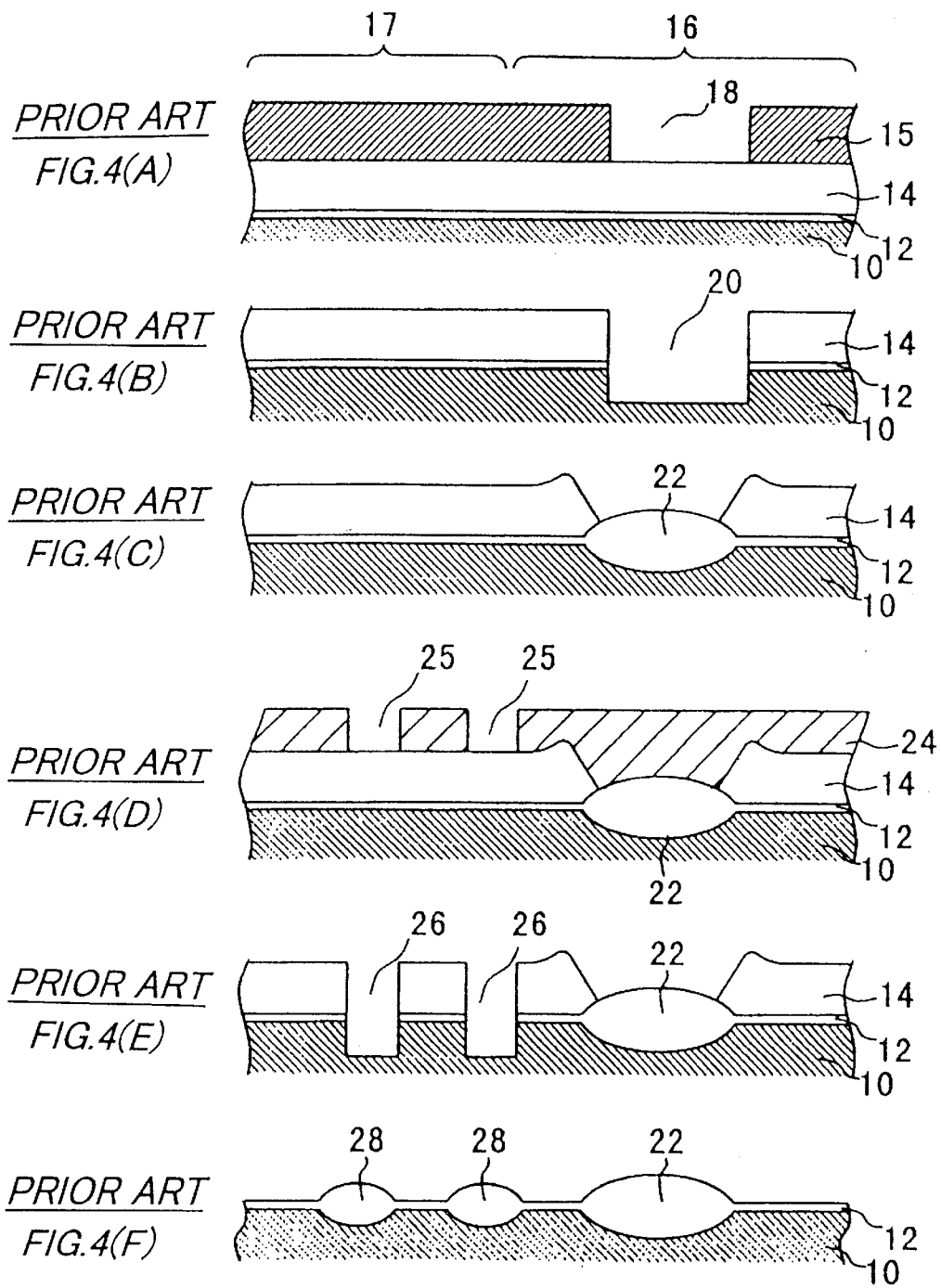
PRIOR ART
FIG.4(A)
PRIOR ART
FIG.4(B)
PRIOR ART
FIG.4(C)
PRIOR ART
FIG.4(D)
PRIOR ART
FIG.4(E)
PRIOR ART
FIG.4(F)

SEMICONDUCTOR DEVICE AND METHOD FOR MANUFACTURING THE SAME

BACKGROUND OF THE INVENTION

1. Field of the Invention

The present invention generally relates to a semiconductor device and a method for manufacturing the same. More particularly, the present invention relates to a semiconductor device in which respective elements formed in the vicinity of a plurality of isolation oxide films of different thickness have stable characteristics, as well as to a method for manufacturing the semiconductor device mentioned above.

2. Description of the Background Art

There has been known a semiconductor device comprising a single substrate on which are provided an array of memory cells and a peripheral circuit made of a plurality of elements. In the former semiconductor device, a memory section including memory cells is provided with an isolation oxide film for electrically isolating the individual memory cells from one another. Further, a peripheral circuit section having the peripheral circuit is provided with an isolation oxide film for isolating the individual elements from one another.

The isolation oxide film in the memory section is required to be formed precisely, whereas the isolation oxide film in the peripheral circuit section is required to have a high withstanding voltage. The precision of the isolation oxide film becomes worse as the thickness of the isolation oxide film increases. In contrast, the withstanding voltage of the isolation oxide film becomes higher as the thickness of the isolation oxide film increases. For these reasons, in order to produce the former semiconductor device having the structure mentioned above, two types of isolation oxide films of different thickness must be formed on a single substrate.

FIGS. 4A to 4F are cross-sectional views for describing a former method for forming two types of isolation oxide films of different thickness on a single substrate.

During the former manufacturing method, an oxide film 12, a nitride film 14, and a resist film 15 are formed on a silicon substrate 10 in this sequence (see FIG. 4A). The surface region of the silicon substrate 10 is divided into a peripheral circuit section 16 and a memory section 17. In the resist film 15, an opening 18 is formed on a predetermined area of the peripheral circuit section 16.

While the resist film 15 is used as a mask, anisotropic etching of the nitride film 14, etching of the oxide film 12, and recessing of the silicon substrate 10 are carried out in that order. After completion of recessing of the silicon substrate 10, the resist film 15 is removed from the surface of the nitride film 14 (see FIG. 4B). As a result of the foregoing processing, a recess 20 is formed in the peripheral circuit section 16 of the silicon substrate 10 in such a way as to correspond to the opening 18 of the resist film 15.

Next, the silicon substrate 10 is subjected to thermal oxidation, whereby an isolation oxide film 22 is formed in the recess 20 (see FIG. 4C). The thermal oxidation of the silicon substrate 10 is carried out under the condition in which a sufficient thickness of the isolation oxide film 22 is ensured; namely, under the condition in which a sufficient withstanding voltage of the peripheral circuit section 16 is ensured.

During the former manufacturing method, a resist film 24 is formed on the nitride film 14 (see FIG. 4D). The resist film 24 has openings 25 formed on predetermined areas of the memory section 17.

While the resist film 24 is used as a mask, anisotropic etching of the nitride film 14, etching of the oxide film 12, and recessing of the silicon substrate 10 are carried out in this sequence. After completion of recessing of the silicon substrate 10, the resist film 24 is removed from the surface of the nitride film 14 (see FIG. 4E). As a result of the foregoing processing, recesses 26 are formed in the memory section 17 of the silicon substrate 10 in such a way as to correspond to the openings 25 of the resist film 24.

The silicon substrate 10 is then subjected to thermal oxidation, whereby an isolation oxide film 28 is formed in the recesses 26 of the memory section 17 (see FIG. 4F). The thermal oxidation in this stage is carried out under a condition for ensuring a required thickness of the isolation oxide film 28. The isolation oxide film 28 of the memory section 17 is not required to have a thickness as thick as that required for the isolation oxide film 22 of the peripheral circuit 16. Thus, the foregoing processing results in the isolation oxide film 28 which is formed in the memory section 17 with a high dimensional accuracy.

As mentioned above, the former manufacturing method enables formation, on the single silicon substrate 10, of two types of isolation oxide films of different thickness, i.e., the isolation oxide film 22 having a high withstanding voltage and the isolation oxide film 28 having a high dimensional accuracy. However, in the former manufacturing method, the two types of isolation oxide films 22 and 28 are formed through different processes. Therefore, the former manufacturing method requires complicated manufacturing processes.

SUMMARY OF THE INVENTION

The present invention has been conceived to solve the previously-mentioned problems, and a general object of the present invention is to provide a novel and useful semiconductor device and a method for manufacturing the same.

A more specific object of the present invention is to provide a method for manufacturing a semiconductor device which enables formation, through simple processes, of an isolation oxide film with a high dimensional accuracy and another isolation oxide film ensuring a high withstanding voltage.

The above object of the present invention is achieved by a method for manufacturing a semiconductor device including a plurality of isolation oxide films of different thickness. The method includes a step for forming a nitride film on a silicon substrate. The method also includes a step for forming an opening in the nitride film. The method further includes a step for forming an isolation oxide film below the opening through thermal oxidation. In this method, the opening comprises plurality of openings of different opening diameters and at least one of the opening diameters is set to a value of less than 0.6 $\mu$m.

According to the manufacturing method, a silicon substrate is subjected to thermal oxidation while being covered with a silicon nitride film having a plurality of openings. At least one opening diameter of the opening is less than 0.6 $\mu$m. In the area where the opening has an opening diameter of less than 0.6 $\mu$m, through thermal oxidation an isolation oxide film grows at an rate accurately corresponding to the opening diameter. Therefore, according to the manufacturing method, through single thermal oxidation processing, a plurality of isolation oxide films on whose thickness the opening diameters are accurately reflected can be formed on a single silicon substrate.

A second object of the present invention is to provide a semiconductor device including isolation oxide films of different thickness as well as elements which have stable characteristics while being provided in the vicinity of the respective isolation oxide films.

The above object of the present invention is achieved by a semiconductor device having a plurality of isolation oxide films of different thickness. In the semiconductor device, the peak of isolation impurity concentration is situated at substantially the same depth around all the isolation oxide films. Further, the peak of isolation impurity concentration substantially corresponds to the bottom surface of the thinnest isolation oxide films.

According to the semiconductor device, a peak of isolation impurity concentration substantially corresponds to the bottom of a thinnest isolation oxidation film. The thinner an isolation oxide film, the more likely punch-through is to arise between elements provided across the isolation oxide film. Accordingly, in a semiconductor device having a plurality of isolation oxide films of different thickness, punch-through is most likely to arise below the thinnest isolation oxide film. Punch-through that occurs below the isolation oxide film can be effectively prevented by distributing isolation impurities at high concentration in the vicinity of the bottom surface of the isolation oxide film. Accordingly, the semiconductor device effectively prevents punch-through in the area where punch-through is most likely to occur. Further, according to the semiconductor device, the peak of isolation impurity concentration is situated at substantially the same depth around all the isolation oxide films. The foregoing impurity concentration can be achieved without changing the condition for implanting isolation impurities. Thus, according to the structure, a superior punch-through resistance can be ensured over the entire surface of the substrate, and superior productivity of a semiconductor device can also be ensured.

A third object of the present invention is to provide a method suitable for manufacturing a semiconductor device including isolation oxide films of different thickness as well as elements which have stable characteristics while being provided in the vicinity of the respective isolation oxide films.

The above objects of the present invention are achieved by a method for manufacturing a semiconductor device including a plurality of isolation oxide films of different thickness. The method includes a step for forming the plurality of isolation oxide films of different thickness on a silicon substrate to. The method also includes a step for implanting isolation impurities into regions below the plurality of isolation oxide films of the silicon substrate, under the same conditions. In the method, an implanting condition of the isolation impurity is set such that the position of the concentration peak of the isolation impurities in a depthwise direction substantially corresponds to the bottom surface of the thinnest isolation oxide film.

According to the manufacturing method, isolation impurities are implanted into the entire surface of the silicon substrate under identical conditions such that the peak of impurity concentration substantially corresponds to the bottom surface of the thinnest isolation oxide film. According to the manufacturing method, therefore, a semiconductor device having superior punch-through resistance over the entire surface thereof can be manufactured in simple processes.

Other objects and further features of the present invention will be apparent from the following detailed description when read in conjunction with the accompanying drawings.

BRIEF DESCRIPTION OF THE DRAWINGS

FIGS. 1A through 1C are cross-sectional views for describing a method for manufacturing a semiconductor device according to a first embodiment of the present invention;

FIG. 2 is a plot showing a relation between an opening dimension of a nitride film and a final thickness of an isolation oxide film;

FIGS. 3A through 3E are cross-sectional views for describing a method for manufacturing a semiconductor device according to a second embodiment of the present invention; and FIGS. 4A through 4F are cross-sectional views for describing a former method for manufacturing a semiconductor device.

DESCRIPTION OF THE PREFERRED EMBODIMENTS

In the following, principles and embodiments of the present invention will be described with reference to the accompanying drawings. Throughout the drawings, like reference numerals designate like or corresponding parts, and descriptions of such parts are omitted where they are repetitive.

First Embodiment

FIGS. 1A through 1C are cross-sectional views for describing a method for manufacturing a semiconductor device according to a first embodiment of the present invention.

Under the manufacturing method according to the first embodiment, an oxide film 12, a nitride film 14, and a resist film 30 are formed on a silicon substrate 10 in this sequence (see FIG. 1A). The surface region of the silicon substrate 10 is divided into a peripheral circuit section 16 and a memory section 17. In the resist film 30, an opening 32 is formed on a predetermined area of the peripheral circuit section 16, and openings 34 are formed on predetermined areas of the memory section 17. The manufacturing method according to the first embodiment is characterized in that the openings 32 and 34 are formed in the resist film 30 so as to have relevant opening diameters LW and LN respectively, which are determined by a certain manner described later.

Under the manufacturing method according to the first embodiment, while the resist film 30 is used as a mask, anisotropic etching of the nitride film 14, etching of the oxide film 12, and recessing of the silicon substrate 10 are carried out in this sequence. After completion of recessing of the silicon substrate 10, the resist film 30 is removed from the surface of the nitride film 14 (see FIG. 1B). As a result of the foregoing processing, a recess 36 is formed in the peripheral circuit section 16 of the silicon substrate 10 in such a way as to have a width identical to the diameter LW of the opening 32. Further, recesses 38 are formed in the memory section 17 of the silicon substrate 10 in such a way as to have a width identical to the diameter LN of the openings 34.

Next, the silicon substrate 10 is subjected to thermal oxidation, whereby an isolation oxide film 40 is formed in the recess 36 and an isolation oxide film 42 is formed in each of the recesses 38. After formation of the isolation oxide films 40 and 42, the nitride film 14 is removed from the silicon substrate 10 (see FIG. 1C). As a result of the foregoing processing, the isolation oxide film 40 having a width identical to the opening diameter LW is formed in the peripheral circuit section 16 of the silicon substrate 10, while the isolation oxide film 42 having a width identical to the opening diameter LN is formed in the memory section 17 of the silicon substrate 10.

As mentioned above, the first embodiment has a feature in that both of the diameters LW and LN of the openings 32 and 34 are set to relevant values respectively. The feature of the first embodiment will be described hereunder, by reference to FIGS. 1 and 2.

FIG. 2 shows a relation between an opening diameter of the resist film 30 and the final thickness of an isolation oxide film formed on the silicon substrate 10, i.e., the thickness of an isolation oxide film which is finally obtained through several processes such as removal of the nitride film 14. The relation shown in FIG. 2 is obtained when the silicon substrate 10 is subjected to thermal oxidation under a condition of 5000 angstrom field oxidation (i.e., a condition in which a 5000-angstrom oxide film can be formed on the surface of the silicon substrate 10 in a case where a resist patter is not yet formed thereon).

As shown in FIG. 2, through the thermal oxidation mentioned above, the final thickness of the isolation oxide film is substantially proportional to the opening diameter of the nitride film 14 so long as the diameter assumes a value less than 0.6 μm, whereas keeping the maximum thickness of 3700 angstroms in the area where the opening diameter assumes a value of more than 0.6 μm. According to the relation shown in FIG. 2, there can be derived the following:

(1) In the area where the opening diameter assumes a value of less than 0.6 μm, the rate at which a thermal oxide film grows through thermal oxidation is greatly affected by the opening diameter of the nitride film; and (2) In the area where the opening diameter assumes a value of 0.6 μm or more, the rate at which a thermal oxide film grows through thermal oxidation is not substantially affected by the opening diameter of the nitride film.

In the semiconductor device according to the first embodiment, in order to ensure a withstanding voltage of the peripheral circuit section 16, the isolation oxide film 40 in the section 16 is required to have a final thickness of 3700 angstroms. As shown in FIG. 2, a final thickness of 3700 angstroms can be ensured by setting the opening diameter of the nitride film 14 to a value of 0.6 μm or more, while the condition of the 5000-angstrom field oxidation is used. In other words, in a case where the opening diameter of the nitride film 14 is less than 0.6 μm, in order to ensure a field oxide film having a thickness of 3700 angstroms, the silicon substrate 10 must be subjected to thermal oxidation under a condition which ensures greater thickness than that obtained under the condition of 5000-angstrom field oxidation.

Accordingly, in order to efficiently form an isolation field oxide film to a thickness of 3700 angstroms, the opening diameter of the nitride film 14 is desirably set to a value of 0.6 μm or more. In the manufacturing method according to the first embodiment, the opening diameter LW of the opening 36 formed in the peripheral circuit section 16 of the resist film 30 is set to a value of 0.6 μm. According to this setting, the isolation oxide film 40 having a desired thickness can be efficiently formed in the peripheral circuit section 16. Further, by means of the setting, the width of the isolation oxide film 40 can be minimized, and hence there can be ensured a high density in the peripheral circuit section 16.

In the semiconductor device according to the first embodiment, the isolation oxide film 42 formed in the memory section 17 is required to have a final thickness of 2500 angstroms to ensure a withstanding voltage required in the memory section 17. As mentioned above, during the manufacturing method according to the first embodiment, the isolation oxide film 40 can be efficiently formed in the peripheral circuit section 16 under the condition of the 5000-angstrom field oxidation. As shown in FIG. 2, through the condition of the 5000-angstrom field oxidation, the isolation oxide film 42 can be efficiently formed to a final thickness of 2500 angstroms by the opening diameter of the nitride film 14 being set to a value of 0.3 μm.

In the first embodiment, the opening diameter of the nitride film 14 in the memory section 17 is set to a value of 0.3 μm. According to this setting, in a case where the silicon substrate 10 is subjected to thermal oxidation under the condition of the 5000-angstrom field oxidation, the isolation oxide film 42 having a thickness of 2500 angstroms can be efficiently formed in the memory section 17. The isolation oxide film 42 in the memory section 17 is required to have a high dimensional accuracy. Prevention of an unnecessary increase in the thickness of the isolation oxide film 42 is effective in imparting a high dimensional accuracy to the isolation oxide film 42. As mentioned above, in the present embodiment, the isolation oxide film 42 having the minimum required thickness can be formed by subjecting the silicon substrate 10 to thermal oxidation with the condition of the 5000-angstrom field oxidation. Therefore, through the manufacturing method according to the first embodiment, the isolation oxide film 42 having a high dimensional accuracy can be formed in the memory section 17.

As set forth, under the manufacturing method according to the first embodiment, the isolation oxide film 40 having a high withstanding voltage and the isolation oxide film 42 having a high dimensional accuracy can be simultaneously formed through the single thermal oxidation process performed under the condition of the 5000-angstrom field oxidation. Therefore, the manufacturing method according to the first embodiment enables formation of the isolation oxide films 40 and 42 of different thickness through simple processes.

In the first embodiment, the opening diameter LW in the peripheral circuit section 16 is set to a value of 0.6 μm from the viewpoint of an increase in the density of the peripheral circuit section 16. However, the present invention is not limited to this setting; the opening diameter LW can be set to an arbitrary value, so long as the value is equal to or greater than 0.6 μm.

In the first embodiment, the opening diameter LN in the memory section 17 is set to a value of 0.3 μm; however, the present invention is not limited to this setting. More specifically, the opening diameter LN may be an arbitrary value, so long as the value is less than 0.6 μm.

Although in the first embodiment the silicon substrate 10 is subjected to thermal oxidation under the condition of the 5000-angstrom field oxidation, the setting according to the present invention is not limited to this setting. More specifically, the conditions for thermal oxidation should be determined based on the final thickness of the thickest isolation oxide film. It is, therefore, appropriate that the conditions for thermal oxidation be set according to the final thickness.

Although in the first embodiment two types of isolation oxide films are formed on a single substrate, the number of types of isolation oxide film are not limited to the embodiment. Three or more types of isolation oxide films may be formed. In the case of formation of three or more types of isolation oxide films, the opening diameter for an isolation oxide film having the greatest thickness should be set to a value of 0.6 μm, and the opening diameter for the other isolation oxide films should be set to a relevant value of less than 0.6 μm.

Although in the first embodiment the isolation oxide film 40 is formed in the recess 36 of the silicon substrate 10 and the isolation oxide film 42 is formed in the recess 38 of the same, the method of forming the isolation oxide films 40 and 42 is not limited to the method mentioned above. Alternatively, the silicon substrate 10 may be subjected to thermal oxidation while the areas corresponding to the recesses 36 and 38 are filled with silicon.

Second Embodiment

A second embodiment of the present invention will now be described by reference to FIGS. 3A to 3E.

FIGS. 3A to 3E are cross-sectional views for describing a method for manufacturing a semiconductor device according to the second embodiment of the present invention. The manufacturing method according to the second embodiment is suitable for forming elements having stable characteristics in the peripheral circuit section 16 and the memory section 17, where the isolation oxide films 40 and 42 differing in thickness are respectively provided. More specifically, under the manufacturing method according to the second embodiment, a MOS transistor is formed in the peripheral circuit section 16, and flash memory is formed in the memory section 17. The silicon substrate 10 used for the second embodiment can be manufactured according to the first embodiment.

During the manufacturing method according to the second embodiment, impurities provided for isolation purposes are implanted into the silicon substrate 10 (see FIG. 3A). A curve depicted by two-dot chain line 44 in FIG. 3A denotes a portion having the highest concentration of isolation impurities, i.e., a peak of an isolation impurity concentration. In a case where an N-channel transistor is intended to be formed on the silicon substrate 10, "boron" ions, for example, are implanted into the substrate 10 as isolation impurities. In contrast, in a case where a P-channel transistor is intended to be formed on the substrate 10, "Phosphorus" ions are implanted into the same as isolation impurities.

The isolation impurities are implanted deeper into the silicon substrate 10 in a thin oxide film area than they are in a thick oxide film area. A peak 44 of impurity concentration becomes shallowest in positions immediately below the isolation oxide films 40 and 42 and becomes deeper in positions between the isolation oxide films 40 and 42. The manufacturing method practiced as the second embodiment is first characterized in that the isolation impurities are implanted into the substrate 10 such that the concentration peak 44 thereof substantially accords to the bottom surface of the isolation oxide film 42 having the thinner thickness, as shown in FIG. 3A, in a position immediately below the film 42.

A punch-through phenomenon must be reliably prevented from arising between elements disposed on either side of the isolation oxide film 40 and between elements disposed on either side of the isolation oxide film 42. The thinner the isolation oxide film, the more likely a punch-through phenomenon is to arise between elements provided across the isolation oxide film. Accordingly, in the semiconductor device practiced as the second embodiment, prevention of a punch-through phenomenon between the elements provided across the thin isolation oxide film 42 is particularly important.

A punch-through phenomenon between the elements provided across the isolation oxide film 42 can be prevented by creating a situation in which an depletion layer becomes difficult to arise below the isolation oxide film 42. More specifically, the punch-through phenomenon can be prevented by distributing isolation impurities at high concentrations below the isolation oxide film 42. As mentioned above, according to the second embodiment, isolation impurities can be distributed at high concentrations in the vicinity of the bottom surface of the isolation oxide film 42. For this reason, the second embodiment enables prevention of a punch-through phenomenon among a plurality of elements formed in the memory section 17.

In the second embodiment, implantation of isolation impurities into the memory section 17 and implantation of isolation impurities into the peripheral circuit section 16 are carried out under the same conditions. Accordingly, in the peripheral circuit section 16, the peak 44 of impurity concentrations appears in a position shallower than the bottom surface of the isolation oxide film 40. Such an impurity distribution profile is not optimum for prevention of a punch-through phenomenon between the elements provided across the isolation oxide film 40. However, the isolation oxide film 40 is larger in thickness and width than the isolation oxide film 42. Accordingly, even the foregoing impurity distribution profile can sufficiently prevent a punch-through phenomenon from arising between the elements provided across the isolation oxide film 40.

As mentioned above, under the manufacturing method according to the second embodiment, a superior punch-through resistance can be imparted to the peripheral circuit section 16 and the memory section 17, while isolation impurities are implanted into those sections 16 and 17 under the same conditions. Accordingly, the manufacturing method practiced as the second embodiment can impart a stable characteristic to all the elements while merely performing a simple process.

During the manufacturing method according to the second embodiment, a floating gate 46 of flash memory and an insulation film 48 for covering the floating gate 46 are formed in an active region of the memory section 17; i.e., the area among the isolation oxide films 42. Further, a control gate 50 of flash memory is formed on the insulation film 48, and a gate electrode 52 of a MOS transistor is formed in an active region of the peripheral circuit section 16, i.e., the area among the isolation oxide films 40 (FIG. 3B).

Subsequently, impurities are implanted into predetermined locations of the memory section 17 so as to form source/drain regions 54 of the flash memory (FIG. 3C). In a case where an N-channel transistor is intended to be formed in the memory section 17, "Phosphorus" ions are implanted into the silicon substrate 10 as the impurities mentioned above. In contrast, in a case where a P-channel transistor is to be formed in the memory section 17, "boron" ions are implanted into the silicon substrate 10 as the impurities mentioned above.

After the foregoing process, impurities are implanted into predetermined locations of the peripheral circuit section 16 in order to form LDD (Lightly-Doped Drain) regions 56 (FIG. 3D). In a case where an N-channel transistor is intended to be formed in the peripheral circuit section 16, "P" ions are implanted into the silicon substrate 10 as impurities. In contrast, in a case where a P-channel transistor is to be formed in the peripheral circuit section 16, "B" ions are implanted into the silicon substrate 10 as impurities.

A sidewall 57 is formed around each of the gate electrodes 52, and impurities are implanted into the silicon substrate 10 from a position above the sidewall 57. Through the foregoing processing operations, an area having substantially the same impurity concentration as that of the LDD section 56 (for the sake of convenience, the area will also be called the "LDD section 56") is formed below the sidewall 57. An area having a higher impurity concentration than that of the LDD section 56 is formed around the periphery of the LDD section 56. The area having a high impurity concentration and the LDD section 56 will be generically called a source/drain region 58 hereunder.

In a case where a MOS transistor is formed in the peripheral circuit section 16, it is important that a high junction withstanding voltage be ensured between the source/drain region 58 and the silicon substrate 10. The greater the distance between the source/drain region 58 and the concentration peak 44 of the isolation impurities, the higher the junction withstanding voltage between the source/drain region 58 and the silicon substrate 10. As mentioned above, in the second embodiment, the position of the concentration peak 44 of isolation impurities is determined on the basis of the depth of the bottom surface of the thin isolation oxide film 42. For this reason, the junction withstanding voltage of the MOS transistor in the peripheral circuit section 16 cannot be improved by adjustment of position of the concentration peak 44.

The junction withstanding voltage between the source/drain region 58 and the silicon substrate 10 increases as the impurity concentration of the source/drain region 58 increases as well as the impurity concentration of the silicon substrate 10 increases. Therefore, the junction withstanding voltage of the MOS transistor can be increased by adjusting (i.e., increasing) the impurity concentration of the source/drain region 58, particularly the impurity concentration of the LDD section 56 having a comparatively low impurity concentration.

From the foregoing viewpoint, in the second embodiment, impurities are implanted into the source/drain regions 58 in the peripheral circuit section 16 under a condition independent of the condition for the implantation of impurities into the source/drain regions 54 in the memory section 17 and in a process differing from that for implanting impurities into the source/drain regions 54 in the memory section 17. More specifically, impurities are implanted into the LDD section 56 under a condition for ensuring a certain impurity concentration which implements a desired junction withstanding voltage by being combined with the already-predetermined depth of the concentration peak 44. Accordingly, under the manufacturing method according to the second embodiment, a high junction withstanding voltage can be imparted to the MOS transistor in the peripheral circuit section 16 irrespective of a comparatively shallow position of the concentration peak 44 of isolation impurities.

In a case where a MOS transistor is formed in the peripheral circuit section 16, prevention of punch-through between the two source/drain regions 58 provided across the gate electrode 52 is important just as ensuring the junction withstanding voltage is important. Punch-through between the source/drain regions 58 occurs in a situation in which the LDD regions 56 have a high concentration of impurities and in which a depletion layer in the channel region is apt to extend. For these reasons, it is desirable to determine conditions for implantation of impurities into the LDD regions 56 in consideration of the length of a channel ensured below the gate electrode 52.

In the second embodiment, conditions for implantation of impurities into the LDD regions 56 are determined taking into account the length of a channel ensured below the gate electrode 52. More specifically, the conditions for impurity implantation are determined such that the longer the channel length, the higher the concentration of impurities in the LDD regions 56. Accordingly, under the manufacturing method practiced as the second embodiment, a high junction withstanding voltage and a superior punch-through resistance can be imparted to the MOS transistor in the peripheral circuit section 16.

In the second embodiment, impurities are implanted into the LDD regions (N⁻ regions) at a comparatively high concentration prior to formation of the sidewall 57. However, in a case where the channel of the MOS transistor is sufficiently short, there may arise a case where impurities cannot be implanted into the LDD regions 56 at a high concentration. In such a case, a desired transistor characteristic can be created through NO implantation after formation of the sidewall 57.

Although in the second embodiment the silicon substrate 10 comprising isolation oxide films of different thickness is manufactured according to the first embodiment, the present invention is not limited to such a manufacturing method; the silicon substrate 10 may be manufactured by the existing manufacturing method, i.e., in a process in which a plurality of isolation oxide films of different thickness are manufactured independently of one another.

The major benefits of the present invention described above are summarized as follows:

According to a first aspect of the present invention, a silicon substrate is subjected to thermal oxidation while being covered with a silicon nitride film having a plurality of openings. At least one opening diameter of the opening is less than 0.6$\mu$m. In the area where the opening has an opening diameter of less than 0.6 $\mu$m, through thermal oxidation an isolation oxide film grows at an rate accurately corresponding to the opening diameter. Therefore, according to the present invention, through single thermal oxidation processing, a plurality of isolation oxide films on whose thickness the opening diameters are accurately reflected can be formed on a single silicon substrate.

According to a second aspect of the present invention, an isolation oxide film required for having the largest thickness is formed through use of an opening having a diameter of more than 0.6 $\mu$m. In the area where the opening has a diameter of more than 0.6 $\mu$m, the rate at which an isolation oxide film grows through thermal oxidation is substantially unaffected by the diameter. More specifically, in this area, the growth rate of the isolation oxide film approaches substantially the maximum rate. For this reason, according to the present invention, the isolation oxide film having the largest thickness can be formed efficiently. Further, according to the present invention, another isolation oxide film is formed through use of an opening having a diameter of less than 0.6 $\mu$m. In the area where an opening has a diameter of less than 0.6 $\mu$m, the isolation oxide film grows at a rate accurately corresponding to the opening diameter. Moreover, in the present invention, the opening diameter for the another isolation oxide film is determined in such a way that the thickness of the another oxide film may reach a desired value at the time when the oxide film required the largest thickness has grown appropriately, because of the difference of their film growing rate. Thus, according to the present invention, a plurality of isolation oxide films of different thickness can be efficiently formed on a single silicon substrate through a single step thermal oxidation processing.

According to a third aspect of the present invention, a peak of isolation impurity concentration substantially corresponds to the bottom of a thinnest isolation oxidation film. The thinner an isolation oxide film, the more likely punch-through is to arise between elements provided across the isolation oxide film. Accordingly, in a semiconductor device having a plurality of isolation oxide films of different thickness, punch-through is most likely to arise below the thinnest isolation oxide film. Punch-through that occurs below the isolation oxide film can be effectively prevented by distributing isolation impurities at high concentration in the vicinity of the bottom surface of the isolation oxide film. Accordingly, the present invention effectively prevents punch-through in the area where punch-through is most likely to occur. Further, according to the present invention, the peak of isolation impurity concentration is situated at substantially the same depth around all the isolation oxide films. The foregoing impurity concentration can be achieved without changing the condition for implanting isolation impurities. Thus, according to the present invention, a superior punch-through resistance can be ensured over the entire surface of the substrate, and superior productivity of a semiconductor device can also be ensured.

According to a fourth aspect of the present invention, the impurity concentration of the source/drain regions in the vicinity of the thin isolation oxide film differs from that of the source/drain regions in the vicinity of the thick isolation oxide film. If the peak of impurity concentration is set to a shallow position corresponding to the thin isolation oxide film, it becomes difficult to ensure a distance between the source/drain region and the concentration peak in the vicinity of the thick isolation oxide film. In this case, a withstanding voltage between the source/drain region and the silicon substrate is apt to decrease in the vicinity of the thick isolation oxide film. However, according to the present invention, a high impurity concentration can be imparted to the source/drain regions, and a high withstanding voltage can be ensured between the source/drain region and the silicon substrate.

According to a fifth aspect of the present invention, isolation impurities are implanted into the entire surface of the silicon substrate under identical conditions such that the peak of impurity concentration substantially corresponds to the bottom surface of the thinnest isolation oxide film. According to the present invention, therefore, a semiconductor device having superior punch-through resistance over the entire surface thereof can be manufactured in simple processes.

According to a sixth aspect of the present invention, a high concentration of impurities can be imparted to source/drain regions in the vicinity of a thick isolation oxide film. According to the present invention, a high withstanding voltage can be ensured between the source/drain region and the silicon substrate in the vicinity of the thick isolation oxide film.

Further, the present invention is not limited to these embodiments, but variations and modifications may be made without departing from the scope of the present invention.

The entire disclosure of Japanese Patent Application No. Hei 10-251335 filed on Sep. 4, 1998 including specification, claims, drawings and summary are incorporated herein by reference in its entirety.

What is claimed is:

1. A method for manufacturing a semiconductor device including a plurality of isolation oxide films of different thickness, the method comprising steps of:

forming a nitride film on a silicon substrate;

forming openings in the nitride film; and forming isolation oxide films below the openings through thermal oxidation, and wherein the openings include an opening having a diameter equal to or more than 0.6 $\mu$m as well as an opening having a diameter less than 0.6 $\mu$m;

the thermal oxidation is carried out under a condition by which the isolation oxide film formed under the opening having the diameter equal to or more than 0.6 $\mu$m grows to a desired thickness; and the diameter less than 0.6 $\mu$m is set such that an isolation oxide film formed under the opening having the diameter less than 0.6 $\mu$m grows to a desired thickness in a case where the thermal oxidation is carried out under said condition.

2. A method for manufacturing a semiconductor device including a plurality of isolation oxide films of different thickness, the method comprising the steps of:

forming the plurality of isolation oxide films of different thickness on a silicon substrate to; and implanting isolation impurities into regions below the plurality of isolation oxide films of the silicon substrate, under the same conditions; and wherein an implanting condition of the isolation impurity is set such that the position of the concentration peak of the isolation impurities in a depthwise direction substantially corresponds to the bottom surface of the thinnest isolation oxide film.

3. The method for manufacturing a semiconductor device according to claim 2, wherein impurities differing in conductivity type from the isolation impurities are implanted at a first concentration in the vicinity of the thinnest isolation oxide film, thereby forming a first source/drain region; and impurities differing in conductivity type from the isolation impurities are implanted at a second concentration in the vicinity of the another isolation oxide film, thereby forming a second source/drain region.

* * * * *